(12) United States Patent
Barrow

(10) Patent No.: US 6,521,845 B1
(45) Date of Patent: *Feb. 18, 2003

(54) THERMAL SPREADING ENHANCEMENTS FOR MOTHERBOARDS USING PBGAS

(75) Inventor: Michael Barrow, El Dorado Hills, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 822 days.

(21) Appl. No.: 08/873,973

(22) Filed: Jun. 12, 1997

(51) Int. Cl.[7] ................................................. H05K 1/16
(52) U.S. Cl. ....................... 174/260; 174/261; 174/262; 439/91
(58) Field of Search ................................ 174/250, 255, 174/260, 261, 262, 52.4; 439/66, 74, 91

(56) References Cited

U.S. PATENT DOCUMENTS

| | | | | |
|---|---|---|---|---|
| 5,121,299 A | * | 6/1992 | Frankeny et al. | 174/261 X |
| 5,216,278 A | * | 6/1993 | Lin et al. | 174/52.4 X |
| 5,418,689 A | * | 5/1995 | Alpaugh et al. | 174/250 X |
| 5,459,287 A | * | 10/1995 | Swamy | 174/250 X |
| 5,463,191 A | * | 10/1995 | Bell et al. | 174/260 X |
| 5,691,041 A | * | 11/1997 | Frankeny et al. | 439/74 X |

* cited by examiner

Primary Examiner—Albert W. Paladini
(74) Attorney, Agent, or Firm—Blakely, Sokoloff, Taylor & Zafman LLP

(57) ABSTRACT

A thermally efficient printed circuit board for a ball grid array (BGA) integrated circuit package. The printed circuit board includes a first outer conductive plane located on a top surface of a substrate. A portion of the first outer conductive plane is covered with a solder mask. The solder mask has an opening that exposes a portion of the first outer conductive plane. A solder ball of the BGA package is attached to the exposed portion of the conductive plane to mount the package to the printed circuit board. The outer conductive plane has a wide area that provides a relatively efficient thermal path to conduct heat that flows through the solder ball from the integrated circuit package. Additionally, the outer conductive plane is coupled to internal conductive planes by a plurality of vias. The internal conductive planes further dissipate the heat which flows from the package into the printed circuit board.

18 Claims, 2 Drawing Sheets

THERMAL SPREADING ENHANCEMENTS FOR MOTHERBOARDS USING PBGAS

BACKGROUND OF THE INVENTION

1. Field of the Invention

The present invention relates to a thermally efficient printed circuit board that supports one or more integrated circuit packages.

2. Description of Related Art

Integrated circuits are typically assembled into a package that is soldered to a printed circuit board. There are many types of integrated circuit packages such as pin grid array (PGA), quad flat pack (QFP) and ball grid array (BGA). BGA integrated circuit packages include an integrated circuit that is mounted to a substrate. Located on a top surface of the substrate are a plurality of bond pads that are wire bonded to the integrated circuit. The bond pads are connected to solder pads located on the bottom surface of the substrate by routing traces and a number of vias. The integrated circuit is typically enclosed by a plastic material. Solder balls are attached to the solder pads of the package substrate and then subsequently reflowed to attach the package to a printed circuit board.

Most of the heat generated by the integrated circuit conducts through the substrate and the solder balls, and into the printed circuit board. The heat is typically removed from the circuit board by convective heat transfer. The convective heat transfer rate is increased by enlarging the area from which the heat is removed. It is therefore desirable to have the heat conduct outward from the mounting area of the package. The solder balls are soldered to surface pads of the printed circuit board. The surface pads of the printed circuit board are typically circular shaped pads located on a layer of dielectric material. The dielectric has a relatively low coefficient of the thermal conductivity. Consequently the printed circuit board provides a relatively poor conductive path for the heat generated by the integrated circuit.

Some integrated circuit packages incorporate heat slugs and heat sinks to improve the heat transfer rate from the package and increase the overall thermal efficiency of the assembly. Head slugs and heat sinks can significantly increase the cost of the package. It would be desirable to improve the thermal efficiency of the printed circuit board. It would therefore be desirable to provide a BGA circuit board assembly that is thermally efficient and relatively inexpensive to produce.

SUMMARY OF THE INVENTION

The present invention is a thermally efficient printed circuit board for a ball grid array (BGA) integrated circuit package. The printed circuit board includes a first outer conductive plane located on a top surface of a substrate. A portion of the first outer conductive plane is covered with a solder mask. The solder mask has an opening that exposes a portion of the first outer conductive plane.

DETAILED DESCRIPTION OF THE INVENTION

Figure 1:
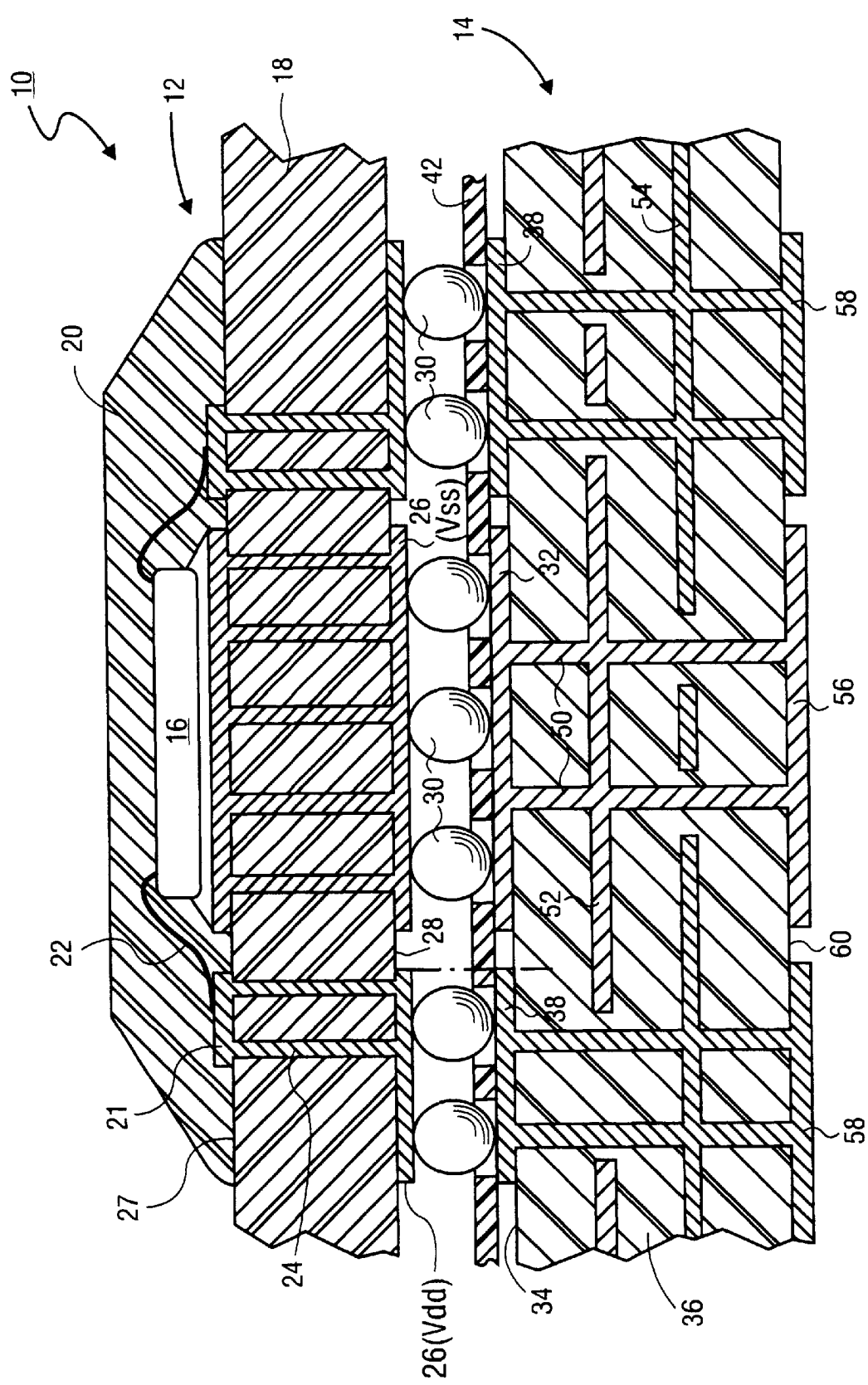
FIG. 1 is a cross-sectional view of an electronic assembly of the present invention.
Figure 2:
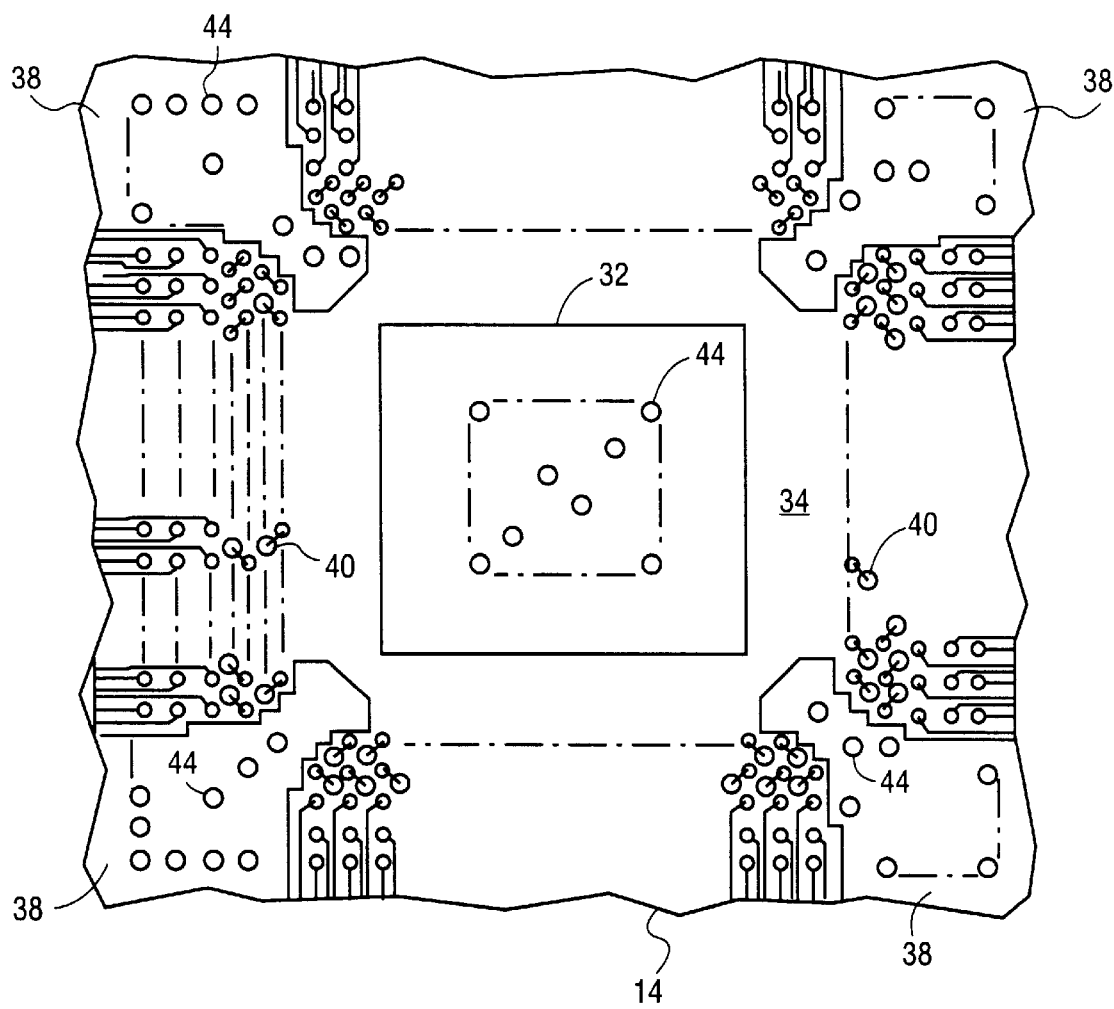
FIG. 2 is top view of a printed circuit board of the electronic assembly.
Figure 3:
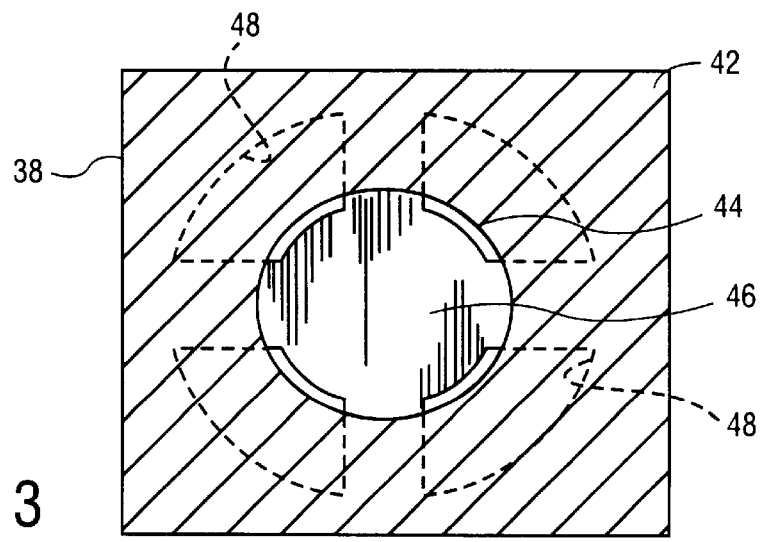
FIG. 3 is an enlarged view of a solder pad of the printed circuit board.

Referring to the drawings more particularly by reference numbers, FIGS. 1–3 show an electronic assembly of the present invention. The electronic assembly 10 includes an integrated circuit package 12 that is mounted to a printed circuit board 14. The package 12 includes an integrated circuit 16 that is mounted to a substrate 18. The integrated circuit 16 may be a microprocessor, although it is to be understood that the package 12 may contain other electrical devices. The integrated circuit 16 is typically enclosed by a plastic material 20.

The integrated circuit 16 is connected to a plurality of bond pads 21 located on the top surface 27 of the substrate 18 by bond wires 22. The substrate 18 contains a plurality of vias 24 that connect the bond pads 21 to a plurality of solder pads 26 located on a bottom surface 28 of the package 12. An inner group of solder pads 26 and vias 24 may be dedicated to electrical ground (Vss). An outer group of solder pads 26 and vias 24 may be dedicated to electrical power (Vdd). The direct via paths and separated Vdd and Vss pads reduce the inductance of the package. Additionally, the construction of the package reduces the thermal impedance through the substrate 18.

A plurality of solder balls 30 are attached to the bottom surface 28 of the substrate 18. The solder balls 30 mount the package 12 to the printed circuit board 14. The package 12 is typically assembled and provided to an assembly site with the solder balls 30 attached to the solder pads 26. Such an integrated circuit package is commonly referred to as a ball grid array (BGA) package. The BGA package 12 is then placed onto the printed circuit board 14 and the solder balls 30 are heated and reflowed to mount the package 12 to the board 14.

Referring to FIG. 2, the printed circuit board 14 includes a first outer conductive plane 32 located on a top surface 34 of a substrate 36. The printed circuit board 14 may also have a plurality of second outer conductive planes 38. The first outer conductive plane 32 is connected to the inner solder pads 26 of the package 12 which are dedicated to electrical ground Vss. The second outer conductive planes 38 are connected to outer solder pads 26 that are dedicated to electrical power Vdd. The circuit board 14 may also have a plurality of individual conductive surface pads 40 that are connected to corresponding individual solder pads of the package and dedicated to digital signals. The pattern on the bottom surface 28 of the package 12 is generally the same as the pattern of the printed circuit board 14. The top surface 34 of the substrate 36 has a layer of solder mask 42. The solder mask 42 has a plurality of openings 44.

Referring to FIG. 3, each opening 44 exposes a contact pad area 46 of the first conductive plane 32. Although not shown, the solder mask 42 also has openings 44 to expose contact pad areas 46 of the second conductive plane 38 and the individual surface pads 40 of the circuit board 14. The openings 44 allow the solder balls 28 to be attached to the conductive planes. The solder mask 42 prevents the solder balls 30 from wicking outside of the contact pad area 46.

The contact pad areas 46 may be plated with a layer of solder material. In the preferred embodiment, each contact pad area 46 has four concentric adhesion openings 48 that are shaped as a segment of a circle. The adhesion openings 48 expose an underlying dielectric layer of the substrate 18. It has been found that the solder mask 42 will more readily adhere to the dielectric material than the copper material of the conductive planes. The adhesion openings 48 therefore increase the peel strength of the solder mask 42 so that the maskant does not delaminate from the circuit board 14.

Referring to FIG. 1, the substrate 36 may have a plurality of vias 50. The vias 50 may connect the first outer conductive plane 32 to a first internal conductive plane 52. The first internal conductive plane 52 is preferably dedicated to electrical power Vss. Likewise, the vias 50 may connect the second outer conductive planes 38 to second internal conductive planes 54 that are dedicated to electrical power Vdd. The vias 50 may also connect the outer conductive planes 32 and 38 to corresponding conductive planes 56 and 58, respectively, located on the bottom surface 60 of the substrate 36.

Most of the heat generated by the integrated circuit 16 conducts through the package substrate 18 and the solder balls 26, and into the conductive planes 32 and 38 of the printed circuit board 14. The relatively large conductive planes provide a large area which can dissipate the heat flowing from the package 12. Additionally, the vias 50 and internal conductive planes 52 and 54 provide another thermal path that dissipates the heat flowing from the package 12. The assembly of the present invention thus provides a thermally efficient printed circuit board for a BGA package. In addition to a lower thermal impedance, the circuit board also provides a relatively strong peel strength for the solder mask of the board.

What is claimed is:

1. A printed circuit board for a ball grid array integrated circuit package, comprising:
    a substrate which has a first outer conductive plane on a top surface of said substrate; and,
    a solder mask that covers said first outer conductive plane and which has a plurality of openings that expose a plurality of contact pad areas of said first outer conductive plane.

2. The printed circuit board as recited in claim 1, wherein said substrate has an adhesion opening that is covered by said solder mask.

3. The printed circuit board as recited in claim 2, wherein said substrate has a plurality of adhesion openings that are concentric with said contact pad area.

4. The printed circuit board as recited in claim 1, wherein said substrate includes a via that is attached to said first outer conductive plane.

5. The printed circuit board as recited in claim 4, wherein said substrate includes a first internal conductive plane that is attached to said via.

6. The printed circuit board as recited in claim 1, wherein said substrate includes a second outer conductive plane on said top surface of said substrate, wherein said solder mask covers said second outer conductive plane and has an opening that exposes a contact pad area of said second outer conductive plane.

7. The printed circuit board as recited in claim 6, wherein said substrate includes a via that is attached to said second outer conductive plane.

8. The printed circuit board as recited in claim 7, wherein said substrate includes a second internal conductive plane that is attached to said via.

9. An electronic assembly, comprising:
    a substrate which has a first outer conductive plane on a top surface of said substrate;
    a solder mask that covers said first outer conductive plane and which has a plurality of openings that expose a plurality of contact pad areas of said first outer conductive plane;
    a ball grid array integrated circuit package that is attached to said contact pad area of said first outer conductive plane.

10. The electronic assembly as recited in claim 9, wherein said substrate has an adhesion opening that is covered by said solder mask.

11. The electronic assembly as recited in claim 10, wherein said substrate includes a first internal conductive plane that is attached to said via.

12. The electronic assembly as recited in claim 11, wherein said substrate includes a via that is attached to said second outer conductive plane.

13. The electronic assembly as recited in claim 12, wherein said substrate includes a second internal conductive plane that is attached to said via.

14. The electronic assembly as recited in claim 10, wherein said substrate has a plurality of adhesion openings that are concentric with said contact pad area.

15. The electronic assembly as recited in claim 9, wherein said substrate includes a via that is attached to said first outer conductive plane.

16. The electronic assembly as recited in claim 9, wherein said substrate includes a second outer conductive plane on said top surface of said substrate wherein said solder mask covers said second outer conductive plane and has an opening that exposes a contact pad area of said second outer conductive plane.

17. The method for constructing a printed circuit board, comprising the steps of:
    a) forming a substrate which has a first outer conductive plane on a top surface of said substrate; and
    b) applying a solder mask to said top surface to cover said first conductive plane and create a plurality of openings that expose a plurality of contact pad areas of said first outer conductive plane.

18. The method as recited in claim 17, further comprising the step of attaching a ball grid array integrated circuit package to said contact pad areas of said first outer conductive plane.

* * * * *